US007108922B2

(12) United States Patent
Lyu et al.

(10) Patent No.: US 7,108,922 B2
(45) Date of Patent: Sep. 19, 2006

(54) SILOXANE-BASED RESIN AND INTERLAYER INSULATING FILM FORMED USING THE SAME

(75) Inventors: Yi Yeol Lyu, Daejeon-Si (KR); Jin Heong Yim, Daejeon-Si (KR); Ki Yong Song, Seoul (KR); Hyun Dam Jeong, Gyeonggi-Do (KR); Joon Sung Ryu, Incheon-Si (KR)

(73) Assignee: Samsung Electronic Co., Ltd., Gyeonngi-do (KR)

( * ) Notice: Subject to any disclaimer, the term of this patent is extended or adjusted under 35 U.S.C. 154(b) by 223 days.

(21) Appl. No.: 10/768,058

(22) Filed: Feb. 2, 2004

(65) Prior Publication Data

US 2005/0049382 A1 Mar. 3, 2005

(30) Foreign Application Priority Data

Sep. 1, 2003 (KR) ................................ 2003-60811

(51) Int. Cl.
*C09D 5/00* (2006.01)
(52) U.S. Cl. .................... 428/447; 528/35; 521/61; 556/4.35; 106/287.16; 106/287.13; 106/287.14
(58) Field of Classification Search ................. 528/35; 556/435; 428/447; 106/287.16, 287.13, 106/287.14; 521/61
See application file for complete search history.

(56) References Cited

U.S. PATENT DOCUMENTS

| 2,590,937 | A | * | 4/1952 | Clark ........................... 528/34 |
| 3,615,272 | A | | 10/1971 | Collins et al. |
| 4,399,266 | A | | 8/1983 | Matsumura et al. |
| 4,756,977 | A | | 7/1988 | Haluska et al. |
| 4,999,397 | A | | 3/1991 | Weiss et al. |
| 5,010,159 | A | | 4/1991 | Bank et al. |
| 5,138,080 | A | * | 8/1992 | Jung et al. .................. 556/430 |
| 5,302,734 | A | * | 4/1994 | Jung et al. .................. 556/406 |
| 5,853,808 | A | | 12/1998 | Arkles et al. |
| 6,000,339 | A | | 12/1999 | Matsuzawa |
| 6,087,521 | A | * | 7/2000 | Jung et al. .................. 556/435 |
| 6,232,424 | B1 | | 5/2001 | Zhong et al. |

FOREIGN PATENT DOCUMENTS

| EP | 98932538.6 | 12/1999 |
| KR | 2003-0060811 A | 7/2003 |

OTHER PUBLICATIONS

Abstract, KR 9507335, Jul. 10, 1992.*
Abstract JP 05093073, Apr. 16, 1993.*

* cited by examiner

*Primary Examiner*—Margaret G. Moore
(74) *Attorney, Agent, or Firm*—Harness, Dickey & Pierce

(57) ABSTRACT

A siloxane-based resin having a novel structure and a semiconductor interlayer insulating film using the same. The siloxane-based resins have a low dielectric constant in addition to excellent mechanical properties and are useful materials in an insulating film between interconnecting layers of a semiconductor device.

10 Claims, No Drawings

SILOXANE-BASED RESIN AND INTERLAYER INSULATING FILM FORMED USING THE SAME

BACKGROUND OF THE INVENTION

This non-provisional application claims priority under 35 U.S.C. § 119(a) from Korean Patent Application No. 2003-60811 filed on Sep. 1, 2003, the subject matter of which is herein incorporated by reference.

FIELD OF THE INVENTION

The present invention relates to a siloxane-based resin and an interlayer insulating film for a semiconductor device using the same. More specifically, the present invention is directed to a siloxane-based resin linked into the form of a multi-ladder and resinous film useful as an insulating film between interconnecting layers of a semiconductor device.

DESCRIPTION OF THE RELATED ART

As the circuit density of multilevel integrated circuit devices increases, the performances of such devices come to depend on a line rate. Accordingly, it is necessary to reduce the capacitances of interlayer insulating films of such integrated circuit devices to decrease the resistance and capacity in the line. Specifically, U.S. Pat. Nos. 3,615,272; 4,399,266; 4,756,977 and 4,999,397 disclose the formation of insulating films by the SOD (spin-on-deposition) method using polysilsesquioxanes having a dielectric constant of 2.5–3.1, as well as good planarization properties, as an alternative for $SiO_2$ having a dielectric constant of 4.00.

Hydrogen silsesquioxanes as well as preparation methods thereof are well known in the art. For example, U.S. Pat. No. 3,615,272 discloses a method of preparing a completely condensed, soluble hydrogen silsesquioxane resin, which comprises the steps of condensing trichlorosilanes in a sulfuric acid medium and washing the resulting resin with water or aqueous sulfuric acid. Also, U.S. Pat. No. 5,010,159 discloses a method of synthesizing a soluble, condensed hydrogen silsesquioxane resin, which comprises the steps of hydrolyzing hydrosilanes in an arylsulfuric acid hydrate-containing a hydrolysis medium and contacting the resulting resin with a neutralizing agent. U.S. Pat. No. 6,232,424 describes a highly soluble silicon resin composition having excellent solution stability, which was prepared by hydrolyzing and polycondensing tetraalkoxysilane, organosilane and organotrialkoxysilane monomers in the presence of water and a catalyst, and their method of preparation. U.S. Pat. No. 6,000,339 discloses a silica-based compound which is useful in improving the resistance to oxygen plasma and in improving the physical properties as well as the thickness of a coating film, which can be obtained through reacting a monomer selected from the group consisting of alkoxysilane, fluorine-containing alkoxysilane and alkylalkoxysilane with a titanium- or zirconium-alkoxide compound in the presence of water and a catalyst. U.S. Pat. No. 5,853,808 discloses that siloxane, silsesquioxane polymers and compositions thereof useful in forming $SiO_2$-rich ceramic coatings, can be obtained from hydrolysis and polycondensation of organosilanes having a β-substituted alkyl group. EP 0 997 497 A1 discloses that hydrolyzation and polycondensation of a certain combination of alkoxysilanes including mono-, di-, tri-, tetraalkoxysilane and trialkoxysilane dimers can provide resinous materials for insulating films.

SUMMARY OF THE INVENTION

A feature of the present invention is to provide a siloxane-based resin linked into the structure of a multi-ladder having excellent solubility and flowability as well as good mechanical properties.

Another feature of the present invention is to provide a low dielectric insulating film using the siloxane-based resin.

In accordance with the present invention, there is provided a siloxane-based resin that is prepared by hydrolyzing and condensing a silane-based monomer represented by Formula 1, selectively mixed with at least one monomer selected from the group consisting of the compounds represented by Formulae 2 to 6, in organic solvent in the presence of an acid or alkaline catalyst and water:

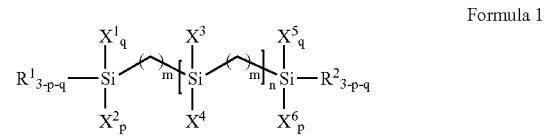

Formula 1 wherein,
R$^1$ and R$^2$ are independently a hydrogen atom, a $C_1$–$C_3$ alkyl group, a $C_3$–$C_{10}$ cycloalkyl group or a $C_6$–$C_{15}$ aryl group;
X$^1$, X$^2$, X$^3$, X$^4$, X$^5$, and X$^6$ are independently a halogen atom or a $C_1$–$C_5$ alkoxy group;
m is an integer of 1–5;
n is an integer of 1–3; and
p and q are independently an integer of 0–1,

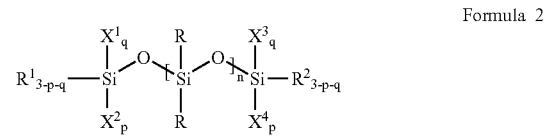

Formula 2 wherein,
R$^1$, R$^2$ and R are independently a hydrogen atom, a $C_1$–$C_3$ alkyl group, a $C_3$–$C_{10}$ cycloalkyl group or a $C_6$–$C_{15}$ aryl group;
X$^1$, X$^2$, X$^3$ and X$^4$ are independently a halogen atom or a $C_1$–$C_5$ alkoxy group;
n is an integer of 1–3; and
p and q are independently an integer of 0–1,

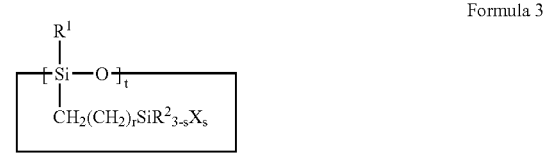

Formula 3 wherein,
R$^1$ and R$^2$ are independently a hydrogen atom, a $C_1$–$C_3$ alkyl group, a $C_3$–$C_{10}$ cycloalkyl group or a $C_6$–$C_{15}$ aryl group;
X$_s$ is a halogen atom, or a $C_1$–$C_5$ alkoxy group;
r is an integer of 0–10;

s is an integer of 1–3; and
t is an integer of 3–8,

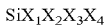 Formula 4

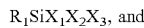 Formula 5

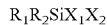 Formula 6 wherein,
$R_1$ and $R_2$ are independently a hydrogen atom, a $C_1$–$C_3$ alkyl group, a $C_3$–$C_{10}$ cycloalkyl group or a $C_6$–$C_{15}$ aryl group; and
$X_1$, $X_2$, $X_3$ and $X_4$ are independently a halogen atom or a $C_1$–$C_5$ alkoxy group.

In accordance with another feature of the present invention, there is provided a composition for forming a semiconductor interlayer insulating film.

In accordance with still another feature of the present invention, there is provided a method of forming a semiconductor interlayer insulating film, comprising the steps of:
providing a resin solution by dissolving the siloxane-based resin in an organic solvent; and
coating a silicon wafer with the resin solution; and
heat-curing the resulting coating film.

In accordance with another feature of the present invention, there is provided a semiconductor interlayer insulating film containing the siloxane-based resin of the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Hereinafter, the present invention will be explained in more detail.

A multi-crosslinkable siloxane monomer used in the present invention has a structure in which the silicon atom is linked by a carbon atom, and the silicon atom has at least one hydrolysable functional group. The structure is represented by Formula 1:

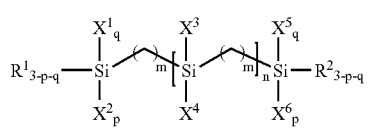 Formula 1 wherein,
$R^1$ and $R^2$ are independently a hydrogen atom, a $C_1$–$C_3$ alkyl group, a $C_3$–$C_{10}$ cycloalkyl group or a $C_6$–$C_{15}$ aryl group;
$X^1$, $X^2$, $X^3$, $X^4$, $X^5$ and $X^6$ are independently a halogen atom or a $C_1$–$C_5$ alkoxy group;
m is an integer of 1–5;
n is an integer of 1–3; and
p and q are independently an integer of 0–1, In the preparation of the siloxane-based resin according to the present invention, a linear or a cyclic siloxane monomer may be further added. The linear siloxane monomer has a linear structure in which a silicon atom and at least one hydrolyzable group is contained in the terminal part of the monomer. It is represented by Formula 2:

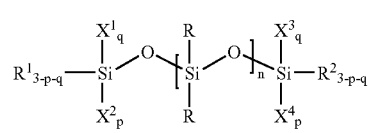 Formula 2 wherein,
$R^1$, $R^2$ and R are independently a hydrogen atom, a $C_1$–$C_3$ alkyl group, a $C_3$–$C_{10}$ cycloalkyl group or a $C_6$–$C_{15}$ aryl group;
$X^1$, $X^2$, $X^3$ and $X^4$ are independently a halogen atom or a $C_1$–$C_5$ alkoxy group;
n is an integer of 1–3; and
p and q are independently an integer of 0–1.

The cyclic siloxane monomer has a cyclic structure, in which a silicon atom and at least one hydrolyzable group is present. It is represented by Formula 3:

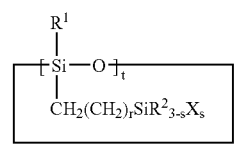 Formula 3 wherein,
$R^1$ and $R^2$ are independently a hydrogen atom, a $C_1$–$C_3$ alkyl group, a $C_3$–$C_{10}$ cycloalkyl group or a $C_6$–$C_{15}$ aryl group;
$X_s$ is a halogen atom, or a $C_1$–$C_5$ alkoxy group;
r is an integer of 0–10;
s is an integer of 1–3; and
t is an integer of 3–8.

In addition, silane compounds having at least two hydroyzable functional groups may be used. The silane compounds are represented by Formulae 4 to 6:

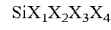 Formula 4

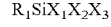 Formula 5

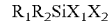 Formula 6 wherein,
$R_1$ and $R_2$ are independently a hydrogen atom, a $C_1$–$C_3$ alkyl group, a $C_3$–$C_{10}$ cycloalkyl group or a $C_6$–$C_{15}$ aryl group; and
$X_1$, $X_2$, $X_3$ and $X_4$ are independently a halogen atom or a $C_1$–$C_5$ alkoxy group.

Siloxane-based resins according to the present invention are prepared by hydrolyzing and condensing the monomer of Formula 1, selectively mixed with at least one monomer selected from the group consisting of the compounds of Formulas 2 to 6, in an organic solvent in the presence of an acid or alkaline catalyst and water.

In the case where only the monomer of Formula 1 is used in the preparation of the siloxane based resin, a multi-ladder type siloxane resin having excellent solubility in an organic solvent and good flowability is provided. The multi-ladder type siloxane resin may be represented by the following Formula 7:

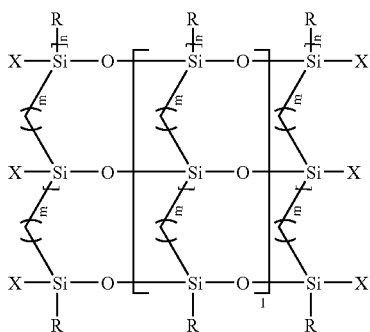

Formula 7 wherein,
X is a halogen atom, a hydroxy group or a $C_{1-5}$ alkoxy group;
R is a hydrogen atom, a $C_{1-3}$ alkyl group, a $C_{3-10}$ cycloalkyl group, or a $C_{6-15}$ aryl group;
l is an integer of 2–10000;
m is an integer of 1–5; and
n is an integer of 1–3.

The above high molecule is in a ladder-form, in which a silicon atom is linked with two carbon atoms and two oxygen atoms, and exhibits the properties of a linear siloxane high molecule and a network siloxane high molecule.

Specifically, the multi-ladder type siloxane-based resin has excellent solubility and flowability as the linear siloxane high molecules as well as the good rigidity of the siloxane main chain, as the network siloxane high molecule. Thus the multi-ladder type siloxane-based resin can be used not only as an insulator film but also as a material with high rigidity in the field of existing siloxane-based high molecules.

In the preparation of the above siloxane-based resin, the monomer of Formula 1 and the monomer selected from the group consisting of the compounds represented by Formulas 2 to 6 are mixed in a molar ratio of 1:99 to 99:1.

As an acid catalyst for the preparation of the inventive siloxane-based resin, hydrochloric acid, nitric acid, benzene sulfonic acid, oxalic acid, formic acid, etc. are exemplified. As a base catalyst, potassium hydroxide, sodium hydroxide, triethylamine, sodium bicarbonate, pyridine, etc. are exemplified. The molar ratio of the catalyst to the monomers of formulas 1 to 6 is 0.000001:1–10:1.

The molar ratio of water used in the preparation of the inventive siloxane-based resin to the monomers of Formulas 1 to 6 is 1:1–1000:1.

Non-limiting examples of the organic solvent used in the preparation of the inventive siloxane-based resin include aliphatic hydrocarbon solvents such as hexane; aromatic hydrocarbon solvents such as anisole, mesitylene and xylene; ketone-based solvents such as methyl isobutyl ketone, 1-methyl-2-pyrrolidinone, cyclohexanone and acetone; ether-based solvents such as tetrahydrofuran and isopropyl ether; acetate-based solvents such as ethyl acetate, butyl acetate and propylene glycol methyl ether acetate; alcohol-based solvents such as isopropyl alcohol and butyl alcohol; amide-based solvents such as dimethylacetamide and dimethylformamide; silicon-based solvents; and a mixture thereof.

According to the present invention, the hydrolysis and polycondensation reaction is carried out at a temperature of 0–200° C., preferably 50–100° C., for 0.1–100 hrs, preferably 0.5–24 hrs.

The siloxane-based resin thus prepared has a Mw of 3,000–300,000. The Si—OR content in the entire terminal groups preferably amounts to 5~50 mol %. If the content is less than 5 mol %, the mechanical stability of the thin film deteriorates. If the content is more than 50 mol %, the storage stability of the composition deteriorates.

The present invention also provides a composition and a method of forming an interlayer insulating film for a semiconductor device using the inventive siloxane-based resin. The insulating film has a low dielectric property below 3.0 and shows excellent mechanical and heat resistance properties. According to the present invention, such an insulating film can be obtained by coating a silicon wafer with a solution containing the inventive siloxane-based resin and heat-curing the resulting coating film. That is, the inventive siloxane-based resin dissolved in an organic solvent is applied to a substrate. Then the organic solvent is evaporated by simple air-drying or by subjecting the substrate, at the beginning of the subsequent heat-curing step, to a vacuum condition or to mild heating at a temperature of 200° C. or less, so that a resinous coating film can be deposited on the surface of the substrate. Thereafter, the resinous coating film is cured by heating the substrate at a temperature of 150–600° C., preferably 200–450° C., for 1–150 minutes, so as to provide an insoluble, substantially crack-free film. As used herein, by "crack-free film" is meant a film without any cracks that can be observed with an optical microscope at a magnification of 1000×. As used herein, by "insoluble film" is meant a film that is substantially insoluble in any solvent described as being useful for dissolving the inventive siloxane-based resin.

According to the present invention, the combined use of a porogen with the inventive siloxane-based resin may further lower the dielectric constant of the final insulating film to 2.50 or less. As used herein, by "porogen" is meant any pore-generating compounds. In case of using a porogen, an additional step of heating the resinous film over the decomposition temperature of the porogen is required so that the porogen can be decomposed.

The porogen used in the present invention may be any of the compounds well known in the art, which can be exemplified by, but are not limited to, cyclodextrin, polycaprolactone, and derivatives thereof. The porogen is mixed in content of 1–70 wt %, based on a total solid content.

Preferred organic solvents for the dissolution of the siloxane-based resin and the porogen to provide a liquid coating composition can be exemplified by, but are not limited to, aliphatic hydrocarbon solvents such as hexane; aromatic hydrocarbon solvents such as anisole, mesitylene and xylene; ketone-based solvents such as methyl isobutyl ketone, 1-methyl-2-pyrrolidinone, cyclohexanone and acetone; ether-based solvents such as tetrahydrofuran and isopropyl ether; acetate-based solvents such as ethyl acetate, butyl acetate and propylene glycol methyl ether acetate; alcohol-based solvents such as isopropyl alcohol and butyl alcohol; amide-based solvents such as dimethylacetamide and dimethylformamide; silicon-based solvents; and a mixture thereof.

In the preparation of the liquid coating composition, the organic solvent should be used in an amount sufficient to apply the solid components including the siloxane-based resin and the porogen evenly to the surface of a wafer. Thus, the organic solvent should amount to 5–70 wt % of the total composition comprising said siloxane-based resin, porogen and organic solvent. If the organic solvent content of the liquid coating composition is less than 5 wt %, part of the siloxane-based resin remains undissolved. On the other hand, if the organic solvent content is more than 50 wt %, the final resinous film is as thin as 1000 Å or less.

In the present invention, the liquid coating composition thus prepared can be applied to a silicon wafer according to various coating methods well known in the art. Non-limiting examples of the coating method useful in the present invention include spin-coating, dip-coating, spray-coating, flow-coating and screen-printing, while spin-coating is most preferred.

Hereinafter, the present invention will be described in more detail with reference to the following examples. However, these examples are given for the purpose of illustration only and should not to be construed as limiting the scope of the present invention.

EXAMPLE 1

Synthesis of Monomer

Example 1-1

Synthesis of Cyclic Monomer (A)

Monomer (A)

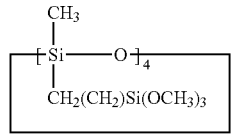

29.014 mmol (10.0 g) of 2,4,6,8-tetramethyl-2,4,6,8-tetravinyltetrasiloxane and 0.164 g of platinum (0)-1,3-divinyl-1,1,3,3-tetramethyldisiloxane complex (solution in xylene) are introduced into a flask, and then diluted with 300 ml of ether. Next, the flask is cooled to −78° C., and 127.66 mmol (17.29 g) of trichlorosilane is slowly added thereto, after which the reaction temperature is gradually elevated to room temperature. The reaction is continued at room temperature for 40 hours, and then volatile materials are removed from the reaction mixture under a reduced pressure of about 0.1 torr. To the reaction mixture, is added 100 ml of hexane and stirred for 1 hour, followed by filtering through celite to produce a colorless, clear solution. And then, hexane is removed from the resulting solution under a reduced pressure of 0.1 torr, to produce a liquid compound represented by the following Formula:

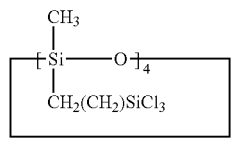

11.28 mmol (10.0 g) of the above liquid compound is diluted with 500 ml of tetrahydrofuran, to which 136.71 mmol (13.83 g) of triethylamine is added. Then, the reaction temperature is cooled to −78° C., and 136.71 mmol (4.38 g) of methylalcohol is slowly added to the reaction solution, after which the reaction temperature is gradually elevated to room temperature. The reaction is continued at room temperature for 15 hrs, followed by filtering through celite, and then volatile materials are evaporated from the filtrate under reduced pressure of about 0.1 torr.

To the resulting solution is added 100 ml of hexane, and stirred for 1 hour, followed by filtering through the celite. Filtrate obtained from the filtration of the stirred solution is mixed with 5 g of activated carbon. And the filtrate thus obtained is subjected to a reduced pressure to remove hexane therefrom and produce monomer (A) as a colorless liquid. The results obtained from NMR analysis of this monomer dissolved in CDCl$_3$, are as follows:

$^1$H NMR(300 MHz) data; δ 0.09 (s, 12H, 4×-CH$_3$), 0.52–0.64 (m, 16H, 4×-CH$_2$CH$_2$—), 3.58 (s, 36H, 4×-[OCH$_3$]$_8$)

Example 1-2

Synthesis of Monomer (B)~(E)

Monomer (B) of 2,4,4,6-tetramethoxy-2,2,6,6-tetramethyl-2,4,6-trissilaheptane and Monomer(C) of 2,2,4,4,6,6-hexamethoxy-2,6-dimethyl-2,4,6-trissilaheptane, are purchased from SII. Co, Rep. Of Korea, is used (Pat. No. 5,075,477).

Monomer(D) of trimethoxysilane and monomer(E) of tetramethoxydimethylsiloxane are purchased from Sigma. Aldrich Co., USA, is used.

Monomer(B):2,4,4,6-tetramethoxy-2,2,6,6-tetramethyl-2,4,6-trissilaheptane

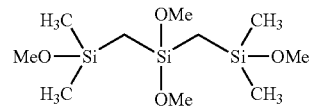

Monomer(C):2,2,4,4,6,6,-hexamethoxy-2,6-dimethyl-2,4,6-trissilaheptane

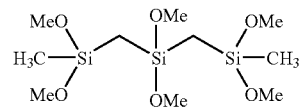

Monomer(D):trismethoxysilane

Monomer (E): tetramethoxydimethylsiloxane

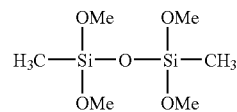

EXAMPLE 2

Synthesis of Siloxane Resin

The monomer is placed into a flask in an amount designated in Table 1, and diluted with tetrahydrofuran 15 times as much as the total amounts of the monomers in the flask. Then, the flask is cooled to −78° C. At −78° C., hydrochloric acid (HCl) and water are added to the flask in an amount designated in Table 1, after which the reaction temperature is gradually elevated to 70° C. The reaction is continued at 70° C. for 20 hours. At the completion of the reaction, the reaction mixture is transferred to a separatory funnel, followed by addition of diethylether and tetrahydrofuran as much as the tetrahydrofuran used in the previous dilution of the monomer. Then, 3× washing is conducted, each round with water one tenth as much as the total solution in the separatory funnel. After washing, volatile materials are evaporated from the remaining solution to produce white powdery polymers. The powder is completely dissolved in a small amount of acetone to obtain a clear solution, and this solution is filtered through a 0.2 μm syringe filter so as to remove impurities to provide a clear filtrate, to which is then slowly added deionized water. As a result, white powdery material is formed, which is then separated from the liquid phase (mixed solution of acetone and water) and dried for 10 hrs at a temperature of 0–20° C. under a reduced pressure of about 0.1 Torr to produce a fractionated siloxane-based resin. The amounts of monomer, acid catalyst, water and acquired siloxane-based resin are represented in Table 1.

TABLE 1

| Siloxane Resin | Monomer (mmol) | | | | | HCl (mmol) | $H_2O$ (mmol) | Final Resin(g) |
|---|---|---|---|---|---|---|---|---|
| | (A) | (B) | (C) | (D) | (E) | | | |
| (a) | — | — | 39.610 | — | — | 0.238 | 663 | 4.5 |
| (b) | — | — | 24.550 | 24.550 | — | 0.221 | 616 | 4.9 |
| (c) | — | 32.733 | — | 32.733 | — | 0.229 | 639 | 5.2 |
| (d) | 8.399 | — | 19.597 | — | — | 0.218 | 609 | 6.5 |
| (e) | 8.399 | — | 8.399 | — | — | 0.151 | 422 | 5.9 |
| (f) | 11.898 | — | 5.412 | — | — | 0.175 | 488 | 6.9 |
| (g) | 8.399 | 19.597 | — | — | — | 0.179 | 500 | 6.4 |
| (h) | 8.399 | 8.399 | — | — | — | 0.134 | 375 | 5.7 |
| (i) | 11.898 | 5.142 | — | — | — | 0.164 | 459 | 6.8 |
| (j) | — | — | 30.950 | — | 13.264 | 0.239 | 667 | 4.7 |
| (k) | — | — | 22.107 | — | 22.107 | 0.221 | 617 | 4.6 |
| (l) | — | — | 13.264 | — | 30.950 | 0.203 | 567 | 5.4 |

EXAMPLE 3

Analysis of the Resin

The respective siloxane-based resins obtained from the above Example 2 are analyzed for Si—OH, Si—OCH$_3$ and S$_1$—CH$_3$ content, as described below. The results are set forth in Table 2.

TABLE 2

| Siloxane Resin | Si—OH (%) | Si—OCH$_3$ (%) | Si—CH$_3$ (%) | Si—H (%) |
|---|---|---|---|---|
| (a) | 18.3 | 0.0 | 81.7 | 0.0 |
| (b) | 9.9 | 0.0 | 60.5 | 29.6 |
| (c) | 0.0 | 0.0 | 80.5 | 19.5 |
| (d) | 28.6 | 1.1 | 70.3 | 0.0 |
| (e) | 32.2 | 0.8 | 66.7 | 0.0 |
| (f) | 35.6 | 1.0 | 63.4 | 0.0 |
| (g) | 23.3 | 0.7 | 76.0 | 0.0 |
| (h) | 30.7 | 2.3 | 67.0 | 0.0 |
| (i) | 33.5 | 1.0 | 65.5 | 0.0 |

TABLE 2-continued

| Siloxane Resin | Si—OH (%) | Si—OCH$_3$ (%) | Si—CH$_3$ (%) | Si—H (%) |
|---|---|---|---|---|
| (j) | 25.7 | 0.0 | 74.3 | 0.0 |
| (k) | 23.7 | 0.3 | 76.4 | 0.0 |
| (l) | 19.5 | 0.5 | 80.0 | 0.0 |

Note:
Si—OH content, Si—OCH$_3$ content, and Si—CH$_3$ content were analyzed by use of a nuclear magnetic resonance analyzer(Bruker Co.), and calculated from the following equations:
Si—OH(%) = Area(Si—OH) ÷ [Ares(Si—H) + Area(Si—OH) + Area(Si—OCH$_3$)/3 + Area(Si—CH$_3$)/3] × 100,
Si—OCH$_3$(%) = Area(Si—OCH$_3$)/3 ÷ [Ares(Si—H) + Area(Si—OH) + Area(Si—OCH$_3$)/3 + Area(Si—CH$_3$)/3] × 100,
Si—CH$_3$(%) = Area(Si—CH$_3$)/3 ÷ [Ares(Si—H) + Area(Si—OH) + Area (Si—OCH$_3$)/3 + Area(Si—CH$_3$)/3] × 100, and
Si—H(%) = Ares(Si—H) ÷ [Ares(Si—H) + Area(Si—OH) + Area(Si—OCH$_3$)/3 + Area(Si—CH$_3$)/3] × 100.

EXAMPLE 4

Measurement of Thickness and Refractive Index of Thin Film

The siloxane-based resins obtained from the above Example 2, and heptakis(2,3,6-tri-O-methoxy)-β-cyclodextrin are dissolved in propylene glycol methyl ether acetate (PGMEA), respectively, so that final concentration of the solid matter in the resulting liquid coating compositions is 25 wt %. Each of the coating compositions is then spin-coated onto a silicon wafer for 30 seconds while maintaining the spin rate of 3,000 rpm. In a nitrogen atmosphere, the coated wafers are subjected to the sequential soft baking on a hot plate (1 min at 100° C. and another minute at 250° C.) so as to sufficiently evaporate the organic solvent. Thereafter, the temperature is elevated to 420° C. at a rate of 3° C./min under vacuum condition, at which temperature the coating films are allowed to cure for 1 hr to produce test pieces.

Each of the test pieces thus prepared is analyzed for film thickness and refractive index. The film thickness and the refractive index are measured at 5 different points every test piece by the use of a profiler and a prism coupler, respectively. The mean thickness and refractive index are set forth in Table 3 along with their uniformity.

TABLE 3

| Composition of resinous film | | | Refractive Index (R.I.) | Uniformity of R.I. (%) | Uniformity of Thick. (%) |
|---|---|---|---|---|---|
| Siloxane Resin | Siloxane Resin (wt %) | Porogen (wt %) | Thick. (Å) | | |
| (a) | 100 | — | 6889 | 1.4257 | 0.064 | 1.09 |
| (a) | 70 | 30 | 4725 | 1.3725 | 0.058 | 1.31 |
| (b) | 100 | — | 12648 | 1.4406 | 0.090 | 0.45 |
| (b) | 70 | 30 | 11273 | 1.3292 | 0.037 | 0.99 |
| (c) | 100 | — | 10193 | 1.4299 | 0.131 | 0.62 |
| (c) | 70 | 30 | 8983 | 1.3298 | 0.105 | 1.01 |
| (d) | 100 | — | 16142 | 1.4350 | 0.110 | 0.45 |
| (d) | 70 | 30 | 10940 | 1.3392 | 0.161 | 1.20 |
| (e) | 100 | — | 14360 | 1.4385 | 0.048 | 1.56 |
| (e) | 70 | 30 | 11397 | 1.3284 | 0.160 | 1.34 |
| (f) | 100 | — | 12767 | 1.4397 | 0.081 | 1.37 |
| (f) | 70 | 30 | 11397 | 1.3283 | 0.097 | 0.57 |
| (g) | 100 | — | 10193 | 1.4367 | 0.048 | 0.92 |
| (g) | 70 | 30 | 9126 | 1.3416 | 0.091 | 1.51 |
| (h) | 100 | — | 11225 | 1.4399 | 0.073 | 1.51 |
| (h) | 70 | 30 | 9724 | 1.3290 | 0.029 | 0.97 |
| (i) | 100 | — | 12553 | 1.4397 | 0.092 | 1.57 |
| (i) | 70 | 30 | 9950 | 1.3311 | 0.106 | 1.18 |
| (j) | 100 | — | 8270 | 1.4129 | 0.031 | 0.22 |
| (j) | 70 | 30 | 5914 | 1.3729 | 0.087 | 0.77 |
| (k) | 100 | — | 8206 | 1.4051 | 0.101 | 1.91 |
| (k) | 70 | 30 | 6089 | 1.3577 | 0.039 | 1.87 |
| (l) | 100 | — | 7071 | 1.3977 | 0.067 | 1.31 |
| (l) | 70 | 30 | 5564 | 1.3250 | 0.080 | 0.14 |

EXAMPLE 5

Measurement of Dielectric Constant

P-type silicon wafers doped with boron are coated with 3000 Å of thermally-oxidized silicon film, followed by sequential deposition of 100 Å of titanium layer, 2000 Å of aluminum layer and 100 Å of titanium layer using a metal evaporator. On the surface of each of these wafers is formed a resinous film in the same manner as in the above Example 4. Subsequently, on the resinous film is deposited a circular electrode of Im diameter which consists of a 100 Å-thick titanium layer and a 5000 Å-thick aluminum layer through a hard mask so as to provide a test piece having a MIM (metal-insulator-metal) structure. Test pieces thus prepared are subjected to measurement of capacitance at 100 kHz using PRECISION LCR METER(HP4284A) with Micromanipulator 6200 probe station. Dielectric constant of each test film is calculated from the following equation, wherein "d" value is obtained by the use of an ellipsometer.

$$k = C \times d / \epsilon_o \times A$$

wherein,
k: dielectric constant
C: capacitance
$\epsilon_o$: dielectric constant in vacuum
d: the thickness of low dielectric film
A: the contact area of electrode The calculated dielectric constants are set forth in Table 4.

TABLE 4

| Thin Film Composition | | | |
|---|---|---|---|
| Siloxane Resin | Siloxane Resin (wt %) | Porogen (wt %) | Dielectric Constant |
| (a) | 100 | — | 2.72 |
| (a) | 70 | 30 | 2.53 |
| (b) | 100 | — | 2.59 |
| (b) | 70 | 30 | 2.18 |
| (c) | 100 | — | 2.75 |
| (c) | 70 | 30 | 2.23 |
| (d) | 100 | — | 2.70 |
| (d) | 70 | 30 | 2.20 |
| (e) | 100 | — | 2.66 |
| (e) | 70 | 30 | 2.19 |
| (f) | 100 | — | 2.73 |
| (f) | 70 | 30 | 2.16 |
| (g) | 100 | — | 2.70 |
| (g) | 70 | 30 | 2.20 |
| (h) | 100 | — | 2.65 |
| (h) | 70 | 30 | 2.15 |
| (i) | 100 | — | 2.60 |
| (i) | 70 | 30 | 2.14 |
| (j) | 100 | — | 2.72 |
| (j) | 70 | 30 | 2.42 |
| (k) | 100 | — | 2.76 |
| (k) | 70 | 30 | 2.33 |
| (l) | 100 | — | 2.71 |
| (l) | 70 | 30 | 2.26 |

EXAMPLE 6

Measurement of Hardness and Modulus

Test pieces prepared as in the above Example 4 are analyzed for hardness and elastic modulus using Nanoindenter II(MTS Co.). The resinous film of each test piece is indented until the indentation depth reached 10% of its whole thickness. At this time, to secure the reliability of this measurement, 6 points is indented every test piece, and mean hardness and modulus are taken. The results are set forth in Table 5.

TABLE 5

| Thin Film Composition | | | Hardness (GPa) | Modulus (GPa) |
|---|---|---|---|---|
| Siloxane Resin | Siloxane Resin (wt %) | Porogen (wt %) | | |
| (a) | 100 | — | 0.43 | 4.77 |
| (a) | 70 | 30 | 0.27 | 4.10 |
| (b) | 100 | — | 1.08 | 7.00 |
| (b) | 70 | 30 | 0.58 | 4.20 |
| (c) | 100 | — | 0.94 | 6.55 |
| (c) | 70 | 30 | 0.51 | 4.00 |
| (d) | 100 | — | 1.04 | 6.53 |
| (d) | 70 | 30 | 0.51 | 3.62 |
| (e) | 100 | — | 0.98 | 7.01 |
| (e) | 70 | 30 | 0.50 | 3.80 |
| (f) | 100 | — | 1.12 | 7.34 |
| (f) | 70 | 30 | 0.59 | 3.91 |
| (g) | 100 | — | 0.71 | 5.10 |
| (g) | 70 | 30 | 0.38 | 2.93 |
| (h) | 100 | — | 0.46 | 5.52 |
| (h) | 70 | 30 | 0.45 | 3.01 |
| (i) | 100 | — | 0.44 | 5.23 |
| (i) | 70 | 30 | 0.31 | 2.97 |
| (j) | 100 | — | 0.49 | 4.44 |
| (j) | 70 | 30 | 0.27 | 3.53 |
| (k) | 100 | — | 0.52 | 5.01 |
| (k) | 70 | 30 | 0.34 | 3.61 |
| (l) | 100 | — | 0.61 | 5.53 |
| (l) | 70 | 30 | 0.39 | 3.81 |

What is claimed is:

1. A composition for preparing a semiconductor interlayer insulating film, comprising:
a siloxane-based resin prepared by hydrolyzing and condensing a silane-based monomer represented by Formula I, selectively mixed with at least one monomer selected from the group consisting of compounds represented by Formulas 2 to 6, in an organic solvent in the presence of an acid or alkaline catalyst and water:

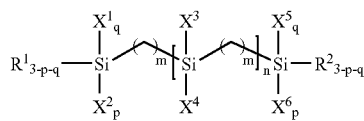

Formula 1 wherein,
$R^1$ and $R^2$ are independently a hydrogen atom, a $C_1$–$C_3$ alkyl group, a $C_3$–$C_{10}$ cycloalkyl group or a $C_6$–$C_{15}$ aryl Group;
$X^1$, $X^2$, $X^3$, $X^4$, $X^5$ and $X^6$ are independently a halogen atom or a $C_1$–$C_5$ alkoxy group;
m is an integer of 1–5;
n is an integer of 1–3; and
p and q are independently an integer of 0–1,

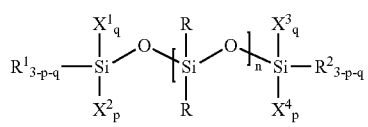

Formula 2 wherein,
$R^1$, $R^2$ and R are independently a hydrogen atom, a $C_1$–$C_3$ alkyl group, a $C_3$–$C_{10}$ cycloalkyl group or a $C_6$–$C_{15}$ aryl group;
$X^1$, $X^2$, $X^3$ and $X^4$ are independently a halogen atom or a $C_1$–$C_5$ alkoxy group;
n is an integer of 1–3; and
p and q are independently an integer of 0–1,

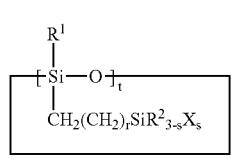

Formula 3 wherein,
$R^1$ and $R^2$ are independently a hydrogen atom, a $C_1$–$C_3$ alkyl group, a $C_3$–$C_{10}$ cycloalkyl group or a $C_6$–$C_{15}$ aryl group;
$X_s$ is a halogen atom, or a $C_1$–$C_5$ alkoxy group;
r is an integer of 0–10;
s is an integer of 1–3; and
t is an integer of 3–8, and $$SiX_1X_2X_3X_4 \qquad \text{Formula 4}$$

$$R_1SiX_1X_2X_3 \qquad \text{Formula 5}$$

$$R_1R_2SiX_1X_2 \qquad \text{Formula 6}$$

wherein,
$R_1$ and $R_2$ are independently a hydrogen atom, a C1–C3 alkyl group, a $C_3$–$C_1$ cycloalkyl group or a $C_6$–$C_{15}$ aryl group; and
$X_1$, $X_2$, $X_3$ and $X_4$ are independently a halogen atom or a $C_1$–$C_5$ alkoxy group; and
a pore-generating material.

2. The composition according to claim 1, wherein the amount of the pore-generating material based on the total amount of the solid components is 1~70 wt %.

3. A composition for preparing a semiconductor interlayer insulating film, comprising:
a siloxane-based resin prepared by hydrolyzing and condensing a silane-based monomer represented by Formula I, selectively mixed with at least one monomer selected from the group consisting of compounds represented by Formulas 2 to 6, in an organic solvent in the presence of an acid or alkaline catalyst and water:

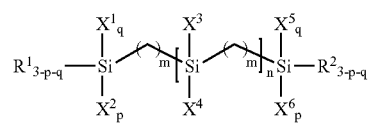

Formula 1 wherein,
$R^1$ and $R^2$ are independently a hydrogen atom, a $C_1$–$C_3$ alkyl group, a $C_3$–$C_{10}$ cycloalkyl group or a $C_6$–$C_{15}$ aryl Group;
$X^1$, $X^2$, $X^3$, $X^4$, $X^5$ and $X^6$ are independently a halogen atom or a $C_1$–$C_5$ alkoxy group;
m is an integer of 1–5;
n is an integer of 1–3; and
p and q are independently an integer of 0–1,

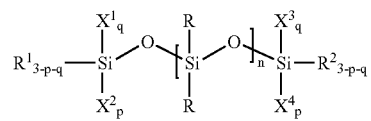

Formula 2 wherein,
$R^1$, $R^2$ and R are independently a hydrogen atom, a $C_1$–$C_3$ alkyl group, a $C_3$–$C_1$ cycloalkyl group or a $C_6$–$C_{15}$ aryl group;
$X^1$, $X^2$, $X^3$ and $X^4$ are independently a halogen atom or a $C_1$–$C_5$ alkoxy group;
n is an integer of 1–3; and
p and q are independently an integer of 0–1,

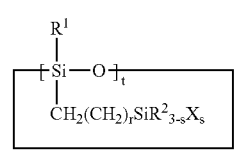

Formula 3 wherein,

R$^1$ and R$^2$ are independently a hydrogen atom, a C$_1$–C$_3$ alkyl group, a C$_3$–C$_{10}$ cycloalkyl group or a C$_6$–C$_{15}$ aryl group;

X$_s$ is a halogen atom, or a C$_1$–C$_5$ alkoxy group;

r is an integer of 0–10;

s is an integer of 1–3; and t is an integer of 3–8, and

SiX$_1$X$_2$X$_3$X$_4$  Formula 4

R$_1$SiX$_1$X$_2$X$_3$  Formula 5

R$_1$R$_2$SiX$_1$X$_2$  Formula 6 wherein,

R$_1$ and R$_2$ are independently a hydrogen atom, a C1–C3 alkyl group, a C$_3$–C$_1$- cycloalkyl group or a C$_6$–C$_{15}$ aryl group; and X$_1$, X$_2$, X$_3$ and X$_4$ are independently a halogen atom or a C$_1$–C$_5$ alkoxy group; and a porogen;

wherein the weight ratio of solid component containing the siloxane-based resin and the porogen is 5–70 wt % based on the total composition.

4. The composition according to claim 3, wherein the porogen is cyclodextrin, polycaprolactone, or a derivative thereof.

5. A method of preparing a semiconductor interlayer insulating film, which comprises:

providing a liquid coating composition by dissolving a siloxane-based resin prepared by hydrolyzing and condensing a silane-based monomer represented by Formula I, selectively mixed with at least one monomer selected from the group consisting of compounds represented by Formulas 2 to 6, in an organic solvent in the presence of an acid or alkaline catalyst and water, further comprising a pore-generating material,

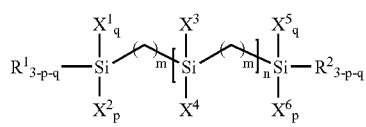

Formula 1 wherein,

R$^1$ and R$^2$ are independently a hydrogen atom, a C$_1$–C$_3$ alkyl group, a C$_3$–C$_{10}$ cycloalkyl group or a C$_6$–C$_{15}$ aryl Group;

X$^1$, X$^2$, X$^3$, X$^4$, X$^5$ and X$^6$ are independently a halogen atom or a C$_1$–C$_5$ alkoxy group;

m is an integer of 1–5;

n is an integer of 1–3; and p and q are independently an integer of 0–1,

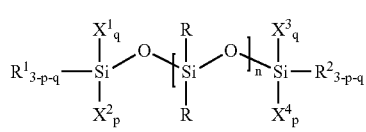

Formula 2 wherein,

R$^1$, R$^2$ and R are independently a hydrogen atom, a C$_1$–C$_3$ alkyl group, a C$_3$–C$_{10}$ cycloalkyl group or a C$_6$–C$_{15}$ aryl group;

X$_1$, X$_2$, X$_3$ and X$_4$ are independently a halogen atom or a C$_1$–C$_5$ alkoxy group;

n is an integer of 1–3; and p and q are independently an integer of 0–1,

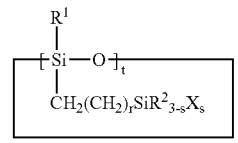

Formula 3 wherein,

R$^1$ and R$^2$ are independently a hydrogen atom, a C$_1$–C$_3$ alkyl group, a C$_3$–C$_{10}$ cycloalkyl group or a C$_6$–C$_{15}$ aryl group;

X$_s$ is a halogen atom, or a C$_1$–C$_5$ alkoxy group;

r is an integer of 0–10;

s is an integer of 1–3; and t is an integer of 3–8, and

SiX$_1$X$_2$X$_3$X$_4$  Formula 4

R$_1$SiX$_1$X$_2$X$_3$  Formula 5

R$_1$R$_2$SiX$_1$X$_2$  Formula 6 wherein,

R$_1$ and R$_2$ are independently a hydrogen atom, a C1–C3 alkyl group, a C$_3$–C$_1$cycloalkyl group or a C$_6$–C$_{15}$ aryl group; and X$_1$, X$_2$, X$_3$ and X$_4$ are independently a halogen atom or a C$_1$–C$_5$ alkoxy group;

coating a silicon wafer with the liquid coating composition to form a coating film; and heat-curing the coating film.

6. The method according to claim 5, wherein the heat curing is performed at a temperature of 150–600° C. for 1–150 min.

7. A semiconductor interlayer insulating film, comprising a siloxane-based resin prepared by hydrolyzing and condensing a silane-based monomer represented by Formula I, selectively mixed with at least one monomer selected from the group consisting of compounds represented by Formulas 2 to 6, in an organic solvent in the presence of an acid or alkaline catalyst and water:

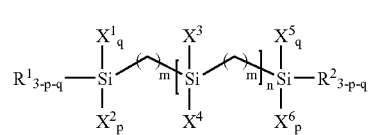

Formula 1 wherein,

R$^1$ and R$^2$ are independently a hydrogen atom, a C$_1$–C$_3$ alkyl group, a C$_3$–C$_{10}$ cycloalkyl group or a C$_6$–C$_{15}$ aryl Group;

X$^1$, X$^2$, X$^3$, X$^4$, X$^5$ and X$^6$ are independently a halogen atom or a C$_1$–C$_5$ alkoxy group;

m is an integer of 1–5;

n is an integer of 1–3; and p and q are independently an integer of 0–1,

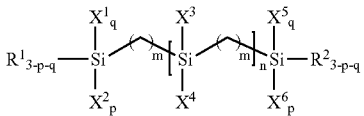

Formula 1 wherein,
$R^1$ and $R^2$ are independently a hydrogen atom, a $C_1$–$C_3$ alkyl group, a $C_3$–$C_{10}$ cycloalkyl group or a $C_6$–$C_{15}$ aryl Group;
$X^1$, $X^2$, $X^3$, $X^4$, $X^5$ and $X^6$ are independently a halogen atom or a $C_1$–$C_5$ alkoxy group;
m is an integer of 1–5;
n is an integer of 1–3; and
p and q are independently an integer of 0–1,

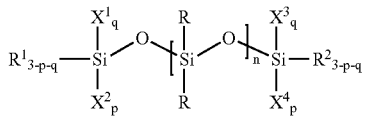

Formula 2 wherein,
$R^1$, $R^2$ and R are independently a hydrogen atom, a $C_1$–$C_3$ alkyl aroup, a $C_3$–$C_{10}$ cycloalkyl group or a $C_6$–$C_{15}$ aryl group;
$X^1$, $X^2$, $X^3$ and $X^4$ are independently a halogen atom or a $C_1$–$C_5$ alkoxy group;
n is an integer of 1–3; and
p and q are independently an integer of 0–1,

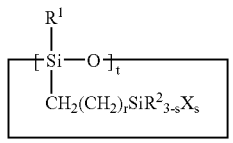

Formula 3 wherein,
$R^1$ and $R^2$ are independently a hydrogen atom, a $C_1$–$C_3$ alkyl group, a $C_3$–$C_{10}$ cycloalkyl group or a $C_6$–$C_{15}$ aryl group;
$X_s$ is a halogen atom, or a $C_1$–$C_5$ alkoxy group;
r is an integer of 0–10;
s is an integer of 1–3; and
t is an integer of 3–8, and $SiX_1X_2X_3X_4$      Formula 4

$R_1SiX_1X_2X_3$      Formula 5

$R_1R_2SiX_1X_2$      Formula 6 wherein,
$R_1$ and $R_2$ are independently a hydrogen atom, a C1–C3 alkyl group, a $C_3$–$C_1$cycloalkyl group or a $C_6$–$C_{15}$ aryl group; and
$X_1$, $X_2$, $X_3$ and $X_4$ are independently a halogen atom or a $C_1$–$C_5$ alkoxy group.

10. The semiconductor device of claim 9, further comprising a porogen.

* * * * *